(12) United States Patent
Hasegawa

(10) Patent No.: US 8,405,204 B2
(45) Date of Patent: Mar. 26, 2013

(54) SEMICONDUCTOR PACKAGE WITH PACKAGE MAIN BODY COOLING STRUCTURE USING COOLANT, AND SEMICONDUCTOR PACKAGE ASSEMBLY WITH THE SEMICONDUCTOR PACKAGE AND COOLANT CIRCULATING STRUCTURE

(75) Inventor: Tsuyoshi Hasegawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/274,582

(22) Filed: Nov. 20, 2008

(65) Prior Publication Data

US 2009/0072386 A1 Mar. 19, 2009

Related U.S. Application Data

(63) Continuation of application No. PCT/JP2007/067340, filed on Sep. 5, 2007.

(30) Foreign Application Priority Data

Sep. 5, 2006 (JP) .................................. 2006-240378

(51) Int. Cl.
*H01L 23/34* (2006.01)
(52) U.S. Cl. .......... 257/714; 257/E23.098; 257/E23.103
(58) Field of Classification Search .................. 257/714, 257/E23.098, E23.103
See application file for complete search history.

(56) References Cited

U.S. PATENT DOCUMENTS

| | | | | |
|---|---|---|---|---|
| 5,349,498 A | * | 9/1994 | Tanzer et al. | ................. 361/689 |
| 2001/0014029 A1 | | 8/2001 | Suzuki et al. | |
| 2009/0008770 A1 | | 1/2009 | Hasegawa | |

FOREIGN PATENT DOCUMENTS

| | | |
|---|---|---|
| FR | 2 500 215 A1 | 8/1982 |
| JP | 5-4498 | 1/1993 |
| JP | 9-307040 A | 11/1997 |
| JP | 2001-308246 A | 11/2001 |
| JP | 2004-103936 A | 4/2004 |
| WO | WO 95/08844 A1 | 3/1995 |

OTHER PUBLICATIONS

U.S. Appl. No. 12/186,129, filed Aug. 5, 2008, Ito, et al.
U.S. Appl. No. 12/579,023, filed Oct. 14, 2009, Takagi, et al.
U.S. Appl. No. 12/533,494, filed Jul. 31, 2009, Hasegawa.
Extended European Search Report issued Nov. 7, 2011, in Patent Application No. 07806782.4.

* cited by examiner

*Primary Examiner* — Robert Huber
(74) *Attorney, Agent, or Firm* — Oblon, Spivak, McClelland, Maier & Neustadt, L.L.P.

(57) ABSTRACT

A semiconductor package includes a main body having a semiconductor device accommodating portion accommodating a basic circuit including a semiconductor device, external connection terminal members protruding outside the main body, and a cooling structure reducing heat generated by the device from the main body. The cooling structure includes a coolant flowing portion including a coolant supply port to which coolant is supplied, a coolant moving space which is positioned adjacent to the accommodating portion and in which the coolant moves in a back side of the basic circuit of the accommodating portion, and a coolant discharge port which discharges the coolant from the moving space. The semiconductor package assembly includes a package support body which supports the package and which includes a coolant circulation structure supplying coolant to the flowing portion of the main body through the supply port and collecting the supplied coolant through the discharge port.

6 Claims, 7 Drawing Sheets

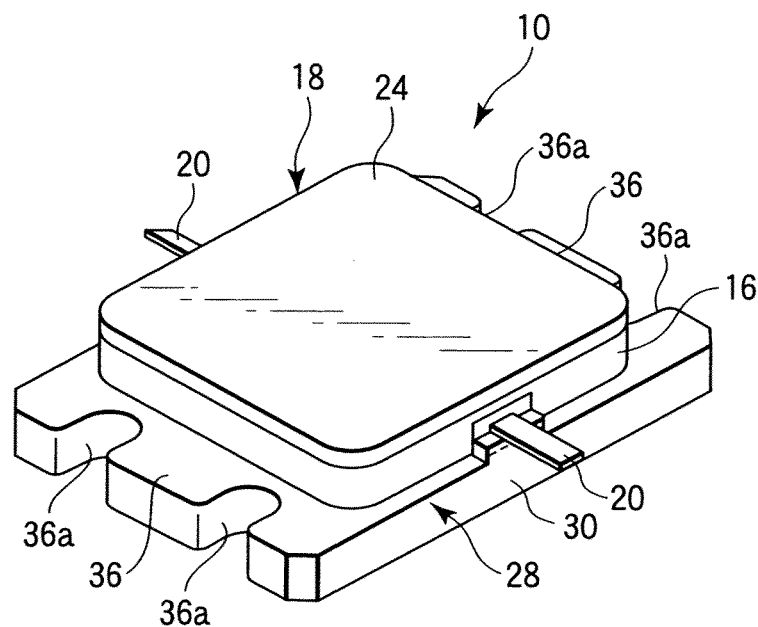
F I G. 1A
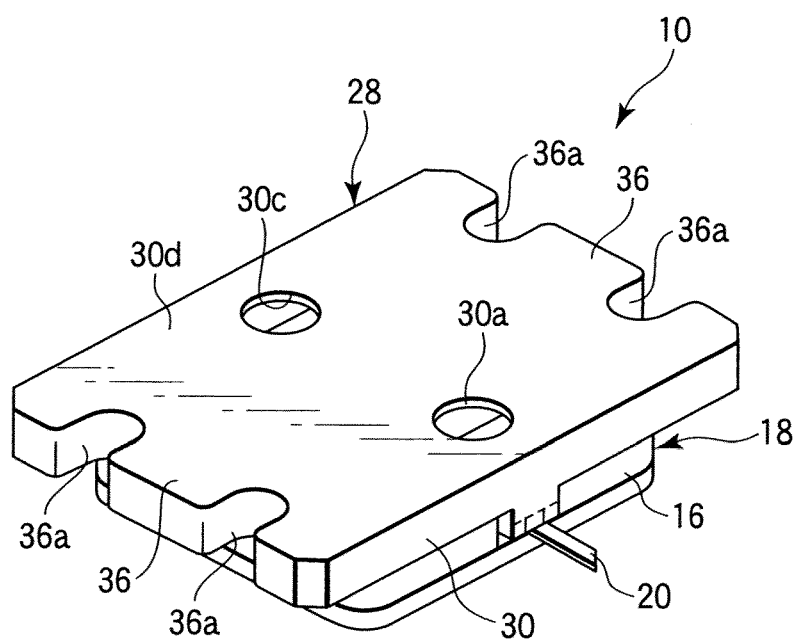
F I G. 1B

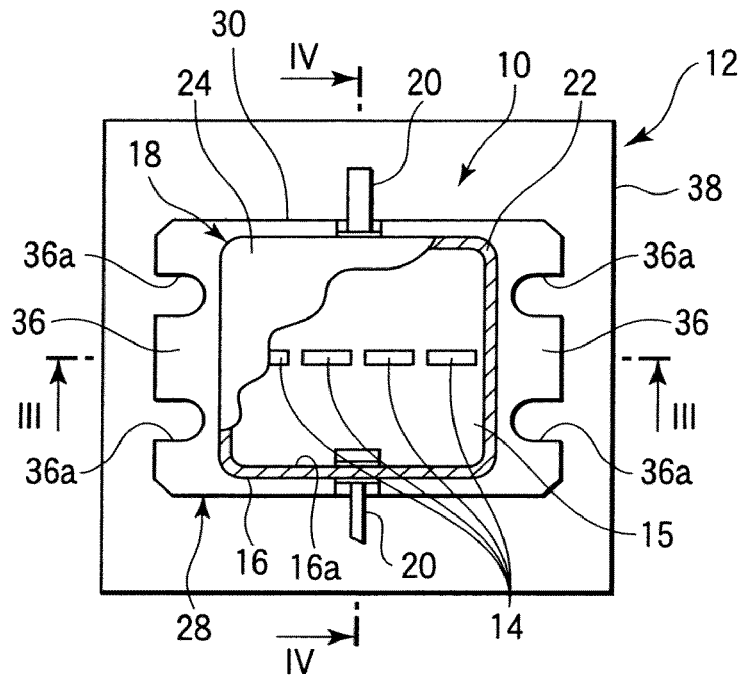
F I G. 2
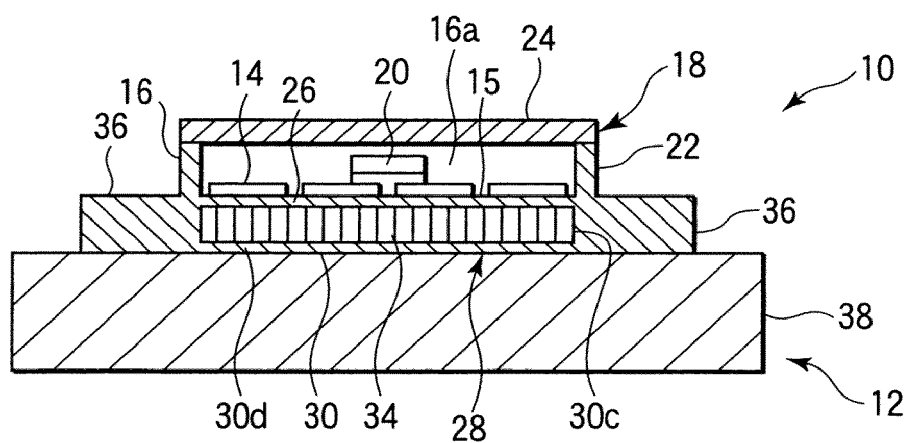
F I G. 3

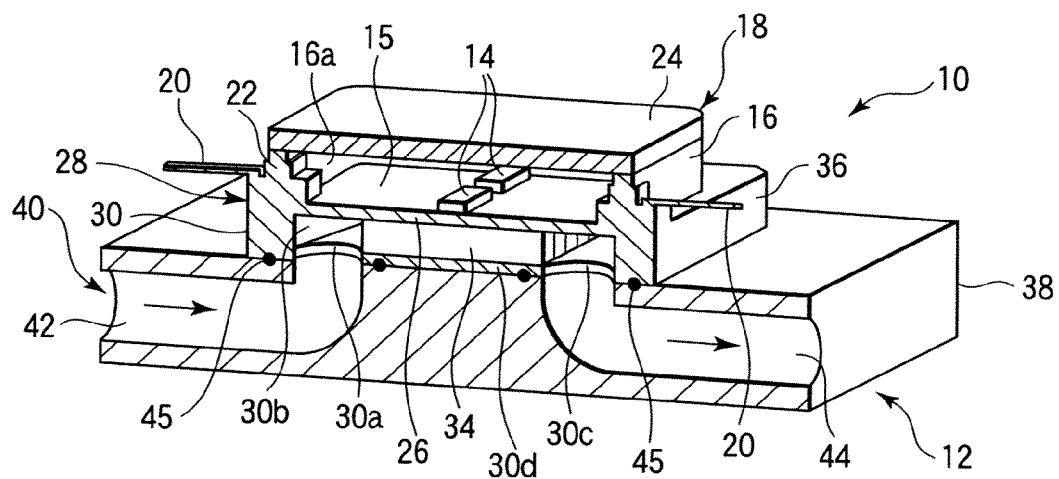
F I G. 4
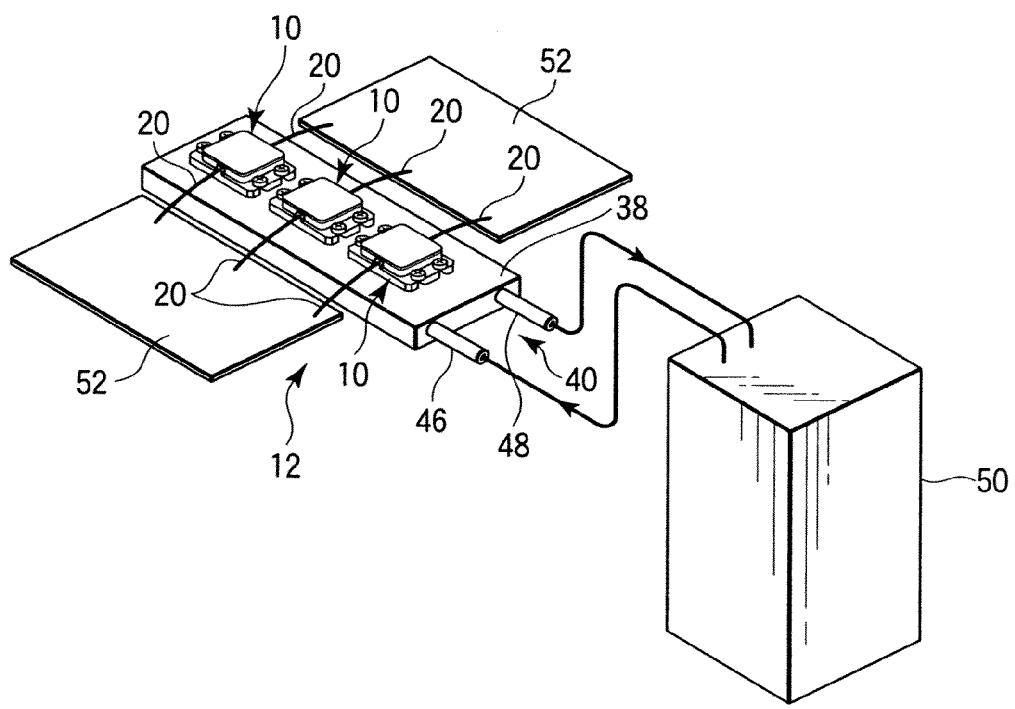
F I G. 5

SEMICONDUCTOR PACKAGE WITH PACKAGE MAIN BODY COOLING STRUCTURE USING COOLANT, AND SEMICONDUCTOR PACKAGE ASSEMBLY WITH THE SEMICONDUCTOR PACKAGE AND COOLANT CIRCULATING STRUCTURE

CROSS-REFERENCE TO RELATED APPLICATIONS

This is a Continuation Application of PCT Application No. PCT/JP2007/067340, filed Sep. 5, 2007, which was published under PCT Article 21(2) in Japanese.

This application is based upon and claims the benefit of priority from prior Japanese Patent Application No. 2006-240378, filed Sep. 5, 2006, the entire contents of which are incorporated herein by reference.

BACKGROUND OF THE INVENTION

1. Field of the Invention

The present invention relates to a semiconductor package which accommodates a semiconductor device and a semiconductor package assembly assembled with the semiconductor package.

2. Description of the Related Art

A semiconductor device typified by, for example, an integrated circuit is distributed and used in a state that the semiconductor device together with a basic circuit including the semiconductor device has been accommodated in a package for assuring its performance. The semiconductor package includes a package main body which accommodates the basic circuit including the semiconductor device, and a plurality of external connection terminal members which is connected to the basic circuit accommodated in the package main body and which protrudes outside the package main body.

The semiconductor package is placed at a predetermined position on a circuit board on which an electrical circuit to be used with the basic circuit accommodated in the semiconductor package is configured, and the plurality of external connection terminal members is electrically connected to a plurality of external connection terminals of the electrical circuit by electrical connection elements such as, for example, solder.

The semiconductor device generates heat with its operation. The semiconductor device is relatively weak against heat, and when a temperature of the semiconductor device reaches a predetermined temperature or higher, the operation of the semiconductor device becomes unstable or becomes inoperative.

In a conventional semiconductor package, the heat generated by the semiconductor device is radiated from the package main body to an atmosphere surrounding the package main body, so that the temperature of the semiconductor device is maintained lower than the predetermined temperature. In recent years, a heat radiation amount from the semiconductor device increases with an improvement of the performance of the semiconductor device, so that a plurality of cooling fins is provided on an outer surface of the package main body or the atmosphere surrounding the package main body is further blown to the cooling fins by a blower.

Recently, a semiconductor device which has a higher performance than that of the conventional one but which uses, for example, gallium nitride (GaN) easily breakable by uneven distribution of heat is also used. A cooling structure for a semiconductor package accommodating such a semiconductor device as described above is disclosed in, for example, Japanese Utility Model Application KOKAI Publication No. 05-4498.

In this cooling structure, a package main body provided on its outer surface with a plurality of cooling fins is immersed in circulating liquid coolant. The above-mentioned outer surface is raised from a central portion toward a peripheral portion, and the above-mentioned circulating liquid coolant is applied toward the central portion. Since the outer surface is raised as described above, an area of the outer surface is increased and turbulence is produced in the liquid coolant flowing from the central portion to the peripheral portion along the outer surface. As a result, a contacting time of the liquid coolant with the outer surface (heat exchange time) is increased.

In the conventional semiconductor package with the above-mentioned conventional cooling structure using liquid coolant, the liquid coolant is flowing along the outer surface of the package main body positioned far from the semiconductor device accommodated in the inner space of the package main body. Therefore, in a case that an amount of heat generated from the semiconductor device further increases with further performance improvement of the semiconductor device, it is surely anticipated that it becomes difficult to control temperature rise of the semiconductor device within a predetermined range by the above-mentioned conventional cooling structure. Further, in the above-mentioned conventional semiconductor package with the above-mentioned conventional cooling structure, the plurality of cooling fins provided on the outer surface of the package main body increases outer dimensions of the whole conventional semiconductor package.

BRIEF SUMMARY OF THE INVENTION

According to one aspect of the present invention, a semiconductor package includes a package main body which has a semiconductor device accommodating portion defining an inner space accommodating a basic circuit including a semiconductor device, a plurality of external connection terminal members which is connected to the basic circuit accommodated in the inner space of the semiconductor device accommodating portion of the package main body and which protrudes outside the package main body, and a cooling structure which reduces heat generated by the semiconductor device from the package main body. The cooling structure comprises a coolant flowing portion, the coolant flowing portion including a coolant supply port to which coolant is supplied, a coolant moving space which is positioned adjacent to the semiconductor device accommodating portion and in which the coolant moves in a back side of the basic circuit of the semiconductor device accommodating portion, and a coolant discharge port which discharges the coolant supplied from the coolant supply port and moving in the coolant moving space, from the coolant moving space.

According to another aspect of the present invention, a semiconductor package assembly comprises: a semiconductor package including a package main body which has a semiconductor device accommodating portion defining an inner space accommodating a basic circuit including a semiconductor device, a plurality of external connection terminal members which is connected to the basic circuit accommodated in the inner space of the semiconductor device accommodating portion of the package main body and which protrudes outside the package main body, and a cooling structure which reduces heat generated by the semiconductor device from the package main body; and a package support body which is combined with the semiconductor package, which supports the semiconductor package, and which includes a coolant circulation structure supplying coolant to the package main body of the semiconductor package and collecting the coolant supplied toward the package main body. The cooling structure comprises a coolant flowing portion, the coolant flowing portion including a coolant supply port to which coolant is supplied, a coolant moving space which is positioned adjacent to the semiconductor device accommodating portion and in which the coolant moves in a back side of the basic circuit of the semiconductor device accommodating portion, and a coolant discharge port which discharges the coolant supplied from the coolant supply port and moving in the coolant moving space from the coolant moving space.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1A is a schematic perspective view of an appearance of a top side of a semiconductor package according to a first embodiment of the present invention;

FIG. 1B is a schematic perspective view of an appearance of a back side of the semiconductor package according to the first embodiment of the present invention;

FIG. 2 is a plan view of a top side of a basic structure of a first embodiment of a semiconductor package assembly assembled with the semiconductor package according to the first embodiment of the present invention, where a part of a package main body is cut out and a plurality of semiconductor devices accommodated in an inner space of the package main body is shown;

FIG. 3 is a schematic vertical cross-sectional view taken along a line III-III in FIG. 2;

FIG. 4 is a schematic vertical cross-sectional view taken along a line IV-IV in FIG. 2;

FIG. 5 is a schematic perspective view of a top side of the whole of the first embodiment of the semiconductor package assembly assembled with the plurality of semiconductor packages, each package according to the first embodiment of the present invention;

DETAILED DESCRIPTION OF THE INVENTION

Figure 6:
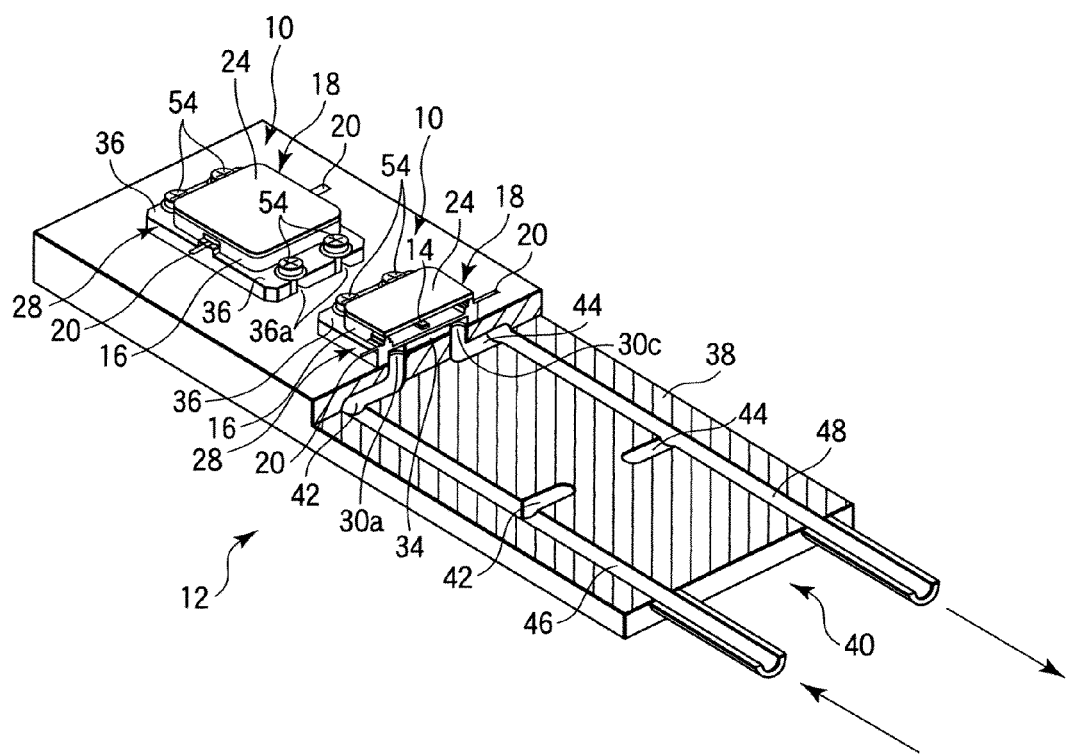
FIG. 6 is a schematic perspective view, where a part of FIG. 5 is shown in a horizontal section.
Figure 7:
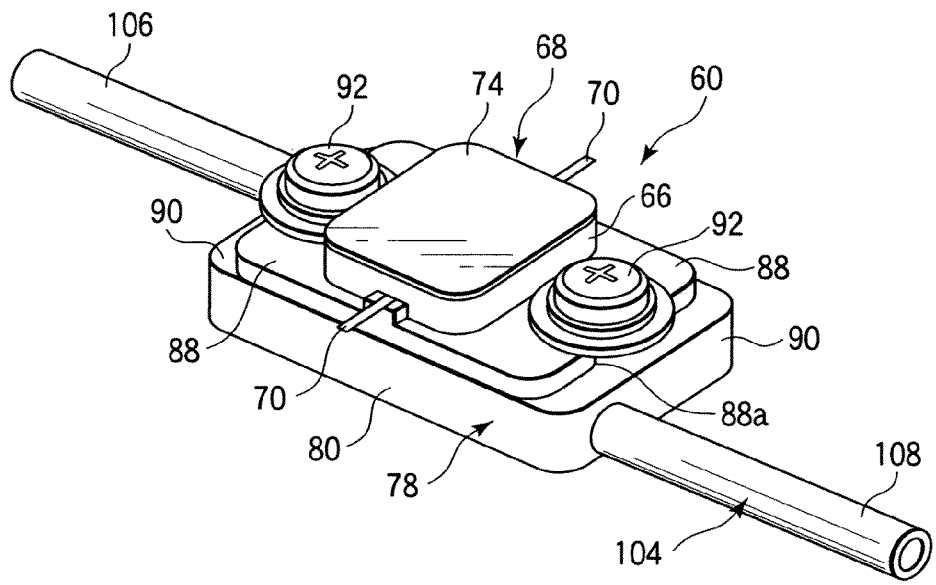
FIG. 7 is a schematic perspective view of a top side of a basic structure of a second embodiment of a semiconductor package assembly assembled with a semiconductor package according to a second embodiment of the present invention.
Figure 8:
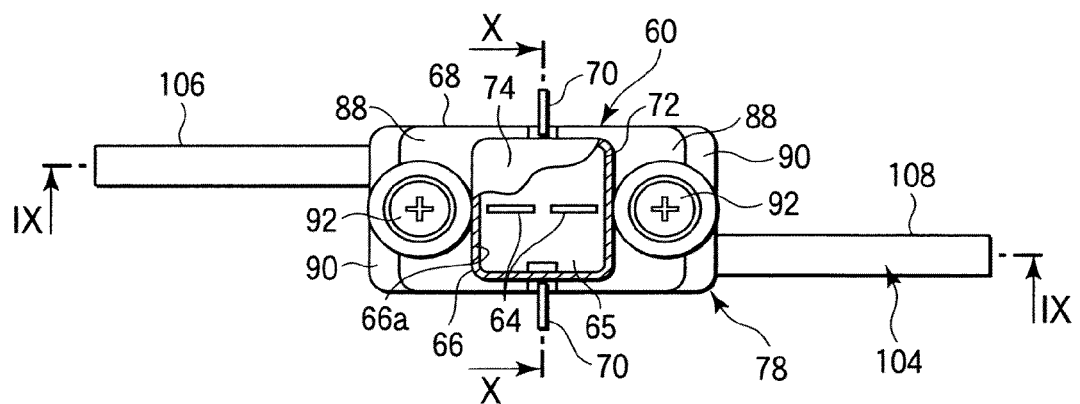
FIG. 8 is a schematic plan view of the top side of the basic structure of the semiconductor package assembly of FIG. 7, where a part of a package main body is cut out and a plurality of semiconductor devices accommodated in an inner space of the package main body is shown.
Figure 9:
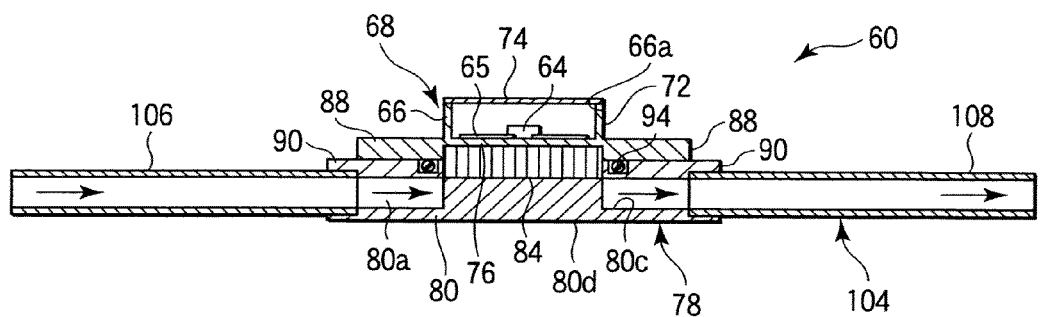
FIG. 9 is a schematic vertical cross-sectional view taken along a line IX-IX in FIG. 8.
Figure 10:
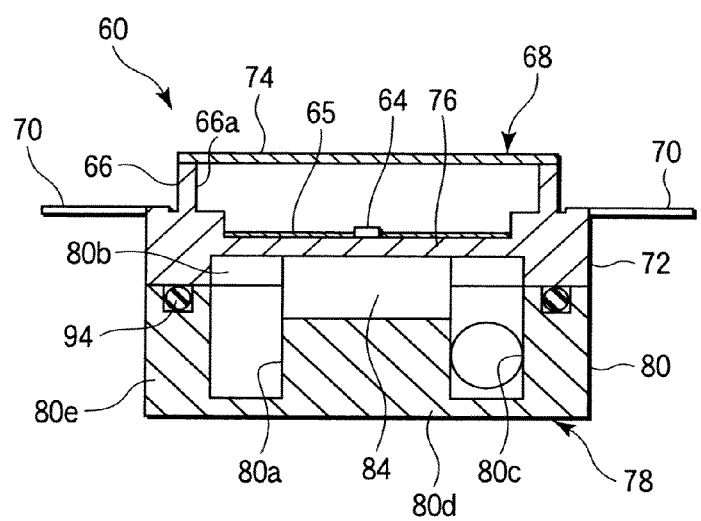
FIG. 10 is a schematic vertical cross-sectional view taken along a line X-X in FIG. 8.

At first, a semiconductor package 10 according to a first embodiment of the present invention and a semiconductor package assembly 12 according to a first embodiment and combined with the semiconductor package 10 will be explained with reference to FIGS. 1A to 4.

The semiconductor package 10 includes a package main body 18 which has a semiconductor accommodating portion 16 defining an inner space 16a accommodating a basic circuit 15 including semiconductor devices 14, for example, integrated circuits, a plurality of external connection terminal members 20 which is connected to a plurality of connection terminals of the basic circuit 15 accommodated in the inner space 16a of the semiconductor accommodating portion 16 and which protrude outside the package main body 18, and a cooling structure 28 which reduces heat generated by the semiconductor devices 14, from the package main body 18. The semiconductor device 14 may be a semiconductor integrated circuit which is typified by a semiconductor integrated circuit of, for example gallium nitride system, which generates much heat during its operating time, and which is easily breakable by a thermal strain.

The package main body 18 is made of a material with excellent thermal conductivity, for example, a metal containing copper or aluminum. The semiconductor accommodating portion 16 of the package main body 18 includes a peripheral wall 22 which defines a circumference of the inner space 16a, a lid 24 which is formed independently of the peripheral wall 22 and which is attached to an opening at one end of the peripheral wall 22 to seal the opening, and a partition wall 26 which is formed integrally with the peripheral wall 22 and which covers an opening at the other end of the peripheral wall.

In the inner space 16a of the semiconductor device accommodating portion 16, the semiconductor devices 14 are supported by the partition wall 26. The semiconductor devices 14 are thermally connected to the partition wall 26. The term "thermal connection" means that the semiconductor device 14 is connected to the partition wall 26 such that heat generated by the semiconductor device 14 during its operation can be transferred from the semiconductor device 14 to the partition wall 26 rapidly. The semiconductor device 14 can be thermally connected to the partition wall 26 by direct contact of the semiconductor device 14 with the partition wall 26 or by indirect contact of the semiconductor device 14 with the partition wall 26 through a member having excellent thermal conductivity. Even in the latter case, a thermal conduction distance between the semiconductor device 14 and the partition wall 26 is very short.

The plurality of external connection terminal members 20 is supported by the peripheral wall 22 of the semiconductor device accommodating portion 16 of the package main body 18 in an electrically insulated state. Inner ends of the external connection terminal members 20 are electrically connected to electrical wires (not shown) of the basic circuit 15 including the semiconductor devices 14 in the inner space 16a of the semiconductor device accommodating portion 16.

The cooling structure 28 which reduces heat generated by the semiconductor devices 14, from the package main body 18 is provided adjacent to the package main body 18. Specifically, the cooling structure 28 includes a coolant flowing portion 30 which is positioned adjacent to the partition wall 26 of the semiconductor device accommodating portion 16 of the package main body 18. The coolant flowing portion 30 has a coolant supply port 30a to which coolant including liquid is supplied, a coolant moving space 30b which moves the coolant supplied from the coolant supply port 30*a* along the partition wall 26 of the semiconductor device accommodating portion 16, and a coolant discharge port 30*c* which discharges the coolant supplied from the coolant supply port 30*a* and moved in the coolant moving space 30*b*, from the coolant moving space 30*b*.

In this embodiment, the cooling structure 28 is formed integrally with the package main body 18, and the coolant flowing portion 30 of the cooling structure 28 includes a bottom wall 30*d* which is positioned in an opposite side of the semiconductor device accommodating portion 16 with the coolant moving space 30*b* being positioned therebetween, and the coolant supply port 30*a* and the coolant discharge port 30*c* are arranged in the bottom wall 30*d* so as to be spaced from each other.

In the coolant moving space 30*b* of the coolant flowing portion 30, a heat radiation area enlarging member 34 protrudes from a part adjacent to the inner space 16*a* of the semiconductor device accommodating portion 16, specifically, the partition wall 26 of the semiconductor device accommodating portion 16 in this embodiment. The heat radiation area enlarging member 34 is arranged on a region of the partition wall 26 corresponding to at least the semiconductor devices 14. The coolant supply port 30*a* and the coolant discharge port 30*c* in the bottom wall 30*d* are arranged in such a positional relationship that makes coolant flow on the heat radiation area enlarging member 34. The heat radiation area enlarging member 34 includes a plurality of fins and clearances among the fins extend from the coolant supply port 30*a* toward the coolant discharge port 30*c* in parallel to one another.

The heat radiation area enlarging member 34 can have any one of various known shapes as far as the shape does not stop a flow of coolant from the coolant supply port 30*a* toward the coolant discharge port 30*c* in the coolant moving space 30*b*, and it includes a plurality of pins or a perforated plate.

Mounting flanges 36 protrude approximately in parallel to the bottom wall 30*d* at a plurality of positions of a peripheral wall surrounding the coolant moving space 30*b* between the bottom wall 30*d* and the partition wall 26 of the semiconductor device accommodating portion 16 in the coolant flowing portion 30. Each mounting flange 36 is formed with fixing element receiving spaces 36*a* for receiving known fixing elements, for example, fixing screws. The mounting flanges 36 are arranged such that the fixing elements received in the fixing element receiving spaces 36*a* and connections of electric wires (not shown) to outer ends of the external connection terminal members 20 do not interfere with each other.

The semiconductor package assembly 12 is further provided with a package support body 38 which is combined with the semiconductor package 10 and which supports the semiconductor package 10.

A basic structure of the package support body 38 of the semiconductor package assembly 12 is shown in FIGS. 2 to 4.

The semiconductor package 10 is placed at a predetermined position on the package support body 38 such that the bottom wall 30*d* of the coolant flowing portion 30 of the cooling structure 28 faces the predetermined position, and the semiconductor package 10 is fixed at the predetermined position by well known fixing elements, for example, fixing screws, received in the fixing element receiving spaces 36*a* of the mounting flanges 36.

The package support body 38 includes a coolant circulation structure 40 which supplies the above-mentioned coolant including liquid to the coolant moving space 30*b* of the coolant flowing portion 30 of the semiconductor package 10 fixed at the predetermined position on the package support body 38 through the coolant supply port 30*a* of the bottom wall 30*d* and which collects the coolant in the coolant moving space 30*b* of the coolant flowing portion 30 through the coolant discharge port 30*c* of the bottom wall 30*d*.

The coolant circulation structure 40 includes a coolant supply conduit 42 having an inlet connected to a coolant supply port of a coolant cooler described in detail later and an outlet opened at the predetermined position on the package support body 38. The coolant circulation structure 40 further includes a coolant collecting conduit 44 having an inlet opened at the predetermined position on the package support body 38 and an outlet connected to a coolant collecting port of the coolant cooler described in detail later.

The outlet of the coolant supply conduit 42 and the inlet of the coolant collecting conduit 44 at the predetermined position on the package support body 38 correspond to the coolant supply port 30*a* and the coolant discharge port 30*c* of the coolant flowing portion 30 of the cooling structure 28 of the semiconductor package 10 fixed at the predetermined position as described above.

Sealing members 45, for example, gaskets or O-rings, are arranged at the predetermined position on the package support body 38 so as to surround the outlet of the coolant supply conduit 42 and the inlet of the coolant collecting conduit 44. Accordingly, when the semiconductor package 10 is fixed at the predetermined position on the package support body 38, the coolant supply port 30*a* and coolant discharge port 30*c* of the coolant flowing portion 30 of the cooling structure 28 of the semiconductor package 10 are connected to the outlet of the coolant supply conduit 42 and the inlet of the coolant collecting conduit 44 at the predetermined position on the package support body 38 in a liquid-tight manner.

Next, a whole configuration of the package support body 38 of the semiconductor package assembly 12 will be explained with reference to FIGS. 5 and 6. A plurality of predetermined positions where a plurality of semiconductor packages 10 is assembled and supported is provided on the whole package support body 38. The structure of each of the predetermined positions is the same as the basic structure described above with reference to FIGS. 2 to 4. In FIG. 6, it is shown that inlets of a plurality of coolant supply conduits 42 formed at the plurality of predetermined positions are connected to an integrated coolant supply conduit 46 in the package support body 38 and outlets of a plurality of coolant collecting conduits 44 formed at the plurality of predetermined positions are connected to an integrated coolant collecting conduit 48 in the package support body 38.

In FIG. 5, it is shown that the integrated coolant supply conduit 46 and the integrated coolant collecting conduit 48 are connected to the coolant supply port and the coolant collecting port of the coolant cooler 50.

In FIG. 5, it is further shown that outer ends of the external connection terminal members 20 of the semiconductor packages 10 fixed at the predetermined positions on the whole package support body 38 are connected to circuit boards 52 which use the basic circuits 15 including the semiconductor devices 14 and accommodated in the semiconductor packages 10.

In FIG. 6, it is shown that the semiconductor packages 10 disposed at the predetermined positions on the whole package support body 38 are fixed at the predetermined positions by the fixing screws which are one example of fixing elements 54 received in the fixing element receiving spaces 36*a* of the mounting flanges 36 of the cooling moving space portions 30 of the cooling structures 28.

In the semiconductor package assembly 12 according to the first embodiment described above with reference to FIGS.

5 and 6, coolant is supplied from the coolant supply port of the coolant cooler 50 to the coolant supply ports 30a of the coolant flowing portions 30 of the cooling structures 28 of the semiconductor packages 10 through the integrated coolant supply conduit 46 of the coolant circulation structure 40 of the package support body 38 and the coolant supply conduits 42 corresponding to the semiconductor packages 10 while the semiconductor devices 14 are operating in the semiconductor packages 10. The coolant which has passed through the plurality of clearances among the plurality of fins of the heat radiation area enlarging member 34 in the coolant moving space 30b of each coolant flowing portion 30 is discharged to the corresponding coolant collecting conduit 44 of the coolant circulation structure 40 through the coolant discharge port 30c of each coolant flowing portion 30. The discharged coolant is collected in the coolant collecting port of the coolant cooler 50 from each coolant collecting conduit 44 through the integrated coolant recovery conduit 48.

Heat generated by the semiconductor devices 14 with operations of the semiconductor devices 14 is transferred to the partition wall 26 of the semiconductor device accommodating portion 16 of the package main body 18 where the plurality of fins of the heat radiation area enlarging member 34 is protruded and cooled by the coolant in the coolant moving space 30b of the cooling flowing portion 30 of the cooling structure 28, and the heat is further carried off from the plurality of fins of the heat radiation area enlarging member 34 by the coolant moving in the coolant moving space 30b of the coolant flowing portion 30.

Since the coolant including liquid has a large heat capacity, temperature rise of the semiconductor devices 14 in the semiconductor device accommodating portion 16 of the package main body 18 is suppressed within a predetermined range. In addition, the temperature distribution in the whole of each semiconductor device 14 becomes approximately even. Accordingly, as described above, even if the semiconductor device 14 is a semiconductor integrated circuit which generates a large amount of heat during operation and which is easily breakable by thermal strain, such as typified by a semiconductor integrated circuit made of, for example, gallium nitride system, instability of operation as well as stopping of operation and cracking is not caused in the semiconductor device 14.

Next, a second embodiment of a semiconductor package 60 according to a second embodiment of the present invention will be explained with reference to FIGS. 7 to 10.

The semiconductor package 60 includes: a package main body 68 which has a semiconductor accommodating portion 66 defining an inner space 66a accommodating a basic circuit 65 including semiconductor devices 64, for example, integrated circuits; a plurality of external connection terminal members 70 which is connected to a plurality of connection terminals of the basic circuit 65 accommodated in the inner space 66a of the semiconductor accommodating portion 66 and which protrude outside the package main body 68; and a cooling structure 78 which reduces heat generated by the semiconductor devices 64 from the package main body 68. The semiconductor device 64 may be a semiconductor integrated circuit which generates much heat during its operation and which is typified by a semiconductor integrated circuit made of, for example, gallium nitride system and being easily breakable by thermal strain.

The package main body 68 is made of a material having excellent thermal conductivity, for example, a metal containing copper or aluminum. The semiconductor accommodating portion 66 of the package main body 68 includes a peripheral wall 72 defining a circumference of the inner space 66a, a lid 74 formed independently of the peripheral wall 72 and attached to an opening of one end of the peripheral wall 72 to seal the opening, and a partition wall 76 formed integrally with the peripheral wall 72 and covering an opening of the peripheral wall 72 at the other end thereof.

The semiconductor devices 64 are supported by the partition wall 76 in the inner space 66a of the semiconductor device accommodating portion 66. The semiconductor devices 64 are thermally connected to the partition wall 76. The term "thermal connection" means that the semiconductor device 64 is connected to the partition wall 76 such that the heat generated by the semiconductor device 64 during its operation can be transferred from the semiconductor device 64 to the partition wall 76 rapidly. The semiconductor device 64 can be thermally connected to the partition wall 76 by a direct contact of the semiconductor device 64 with the partition wall 76 or by an indirect contact of the semiconductor device 64 with the partition wall 76 with a member having an excellent thermal conductivity interposed therebetween. Even in the latter case, a thermal conduction distance between the semiconductor device 64 and the partition wall 76 is very short.

The plurality of external connection terminal members 70 is supported by the peripheral wall 72 of the semiconductor device accommodating portion 66 of the package main body 68 in an electrically insulated state. Inner ends of the external connection terminal members 70 are electrically connected to electric wires (not shown) of the basic circuit 65 including the semiconductor devices 64 in the inner space 66a of the semiconductor device accommodating portion 66.

The cooling structure 28 reducing the heat generated by the semiconductor devices 64 from the package main body 68 is provided adjacent to the package main body 68. Specifically, the cooling structure 78 includes a coolant flowing portion 80 positioned adjacent to the partition wall 76 of the semiconductor device accommodating portion 66 in the package main body 68. The coolant flowing portion 80 is provided with a coolant supply port 80a to which coolant including liquid is supplied, a coolant moving space 80b in which the coolant supplied from the coolant supply port 80a is moved along the partition wall 76 of the semiconductor device accommodating portion 66, and a coolant discharge port 80c which discharges the coolant supplied from the coolant supply port 80a and moved in the coolant moving space 80b from the coolant moving space 80b.

In this embodiment, the cooling structure 78 is formed independently of the package main body 68. The coolant flowing portion 80 of the cooling structure 78 includes a bottom wall 80d which is positioned in an opposite side of the semiconductor device accommodating portion 66 with the coolant moving space 80b being interposed therebetween, and a peripheral wall 80e which surrounds the coolant moving space 80b between the semiconductor device accommodating portion 66 and the bottom wall 80d. The coolant supply port 80a and the coolant discharge port 80c are disposed in the peripheral wall 80e so as to be spaced from each other.

In the coolant moving space 80b of the coolant flowing portion 80, a heat radiation area enlarging member 84 protrudes from a part of the semiconductor device accommodating portion 66 adjacent to the inner space 66a, specifically, the partition wall 76 of the semiconductor device accommodating portion 66 in this embodiment. The heat radiation area enlarging member 84 is disposed on a region of the partition wall 76 corresponding to at least the semiconductor devices 64. The coolant supply port 80a and the coolant discharge port 80c on the peripheral wall 80e of the coolant flowing portion 80 are disposed in such a positional relationship by which coolant flows on the heat radiation area enlarging member 84. The heat radiation area enlarging member 84 includes a plurality of fins, and a plurality of clearances among the plurality of fins extends from the coolant supply port 80*a* toward the coolant discharge port 80*c* in parallel to one another.

The heat radiation area enlarging member 84 takes any one of various known shapes as far as the shape does not stop the flow of the coolant from the coolant supply port 80*a* toward the coolant discharge port 80*c* in the coolant moving space 80*b*, and it can include a plurality of pins or a perforated plate.

Mounting flanges 88 protrude at a plurality of positions of the peripheral wall 72 of the semiconductor device accommodating portion 66 positioned adjacent to the coolant flowing portion 80 of the cooling structure 78 approximately parallel to the partition wall 76. Each mounting flange 88 is formed with a fixing element receiving space 88*a* receiving a well known fixing element, for example, a fixing screw. The mounting flanges 88 are arranged such that the fixing elements received in the fixing element receiving spaces 88*a* and connections of electric wires (not shown) to outer ends of the plurality of the external connection terminal members 70 do not interfere with one another.

A plurality of mounting flanges 90 protrude from an outer surface of the peripheral wall 80*e* of the coolant flowing portion 80 of the cooling structure 78 approximately in parallel to the bottom wall 80*d* at positions corresponding to the plurality of mounting flanges 88 of the peripheral wall 72 of the semiconductor device accommodating portion 66. The plurality of mounting flanges 88 of the peripheral wall 72 of the semiconductor device accommodating portion 66 of the package main body 68 is fixed to the plurality of mounting flanges 90 of the peripheral wall 80*e* of the coolant flowing portion 80 of the cooling structure 78 by well known fixing elements 92, for example fixing screws, received in the fixing element receiving spaces 88*a*.

The coolant moving space 80*b* is opened at an end surface of the peripheral wall 80*e* of the coolant flowing portion 80 of the cooling structure 78 positioned adjacent to the other end of the peripheral wall 72 of the semiconductor device accommodating portion 66 of the package main body 68, and a sealing member 94, for example, a gasket or an O-ring, is disposed so as to surround the opening. Therefore, when the plurality of mounting flanges 88 of the semiconductor device accommodating portion 66 of the package main body 68 is fixed to the plurality of mounting flanges 90 of the coolant flowing portion 80 of the cooling structure 78 as described above, the opening of the coolant moving space 80*b* of the coolant flowing portion 80 is covered with the other end of the peripheral wall 72 of the semiconductor device accommodating portion 66 of the package main body 68 and the partition wall 76 in a liquid-tight manner.

Figure 11:
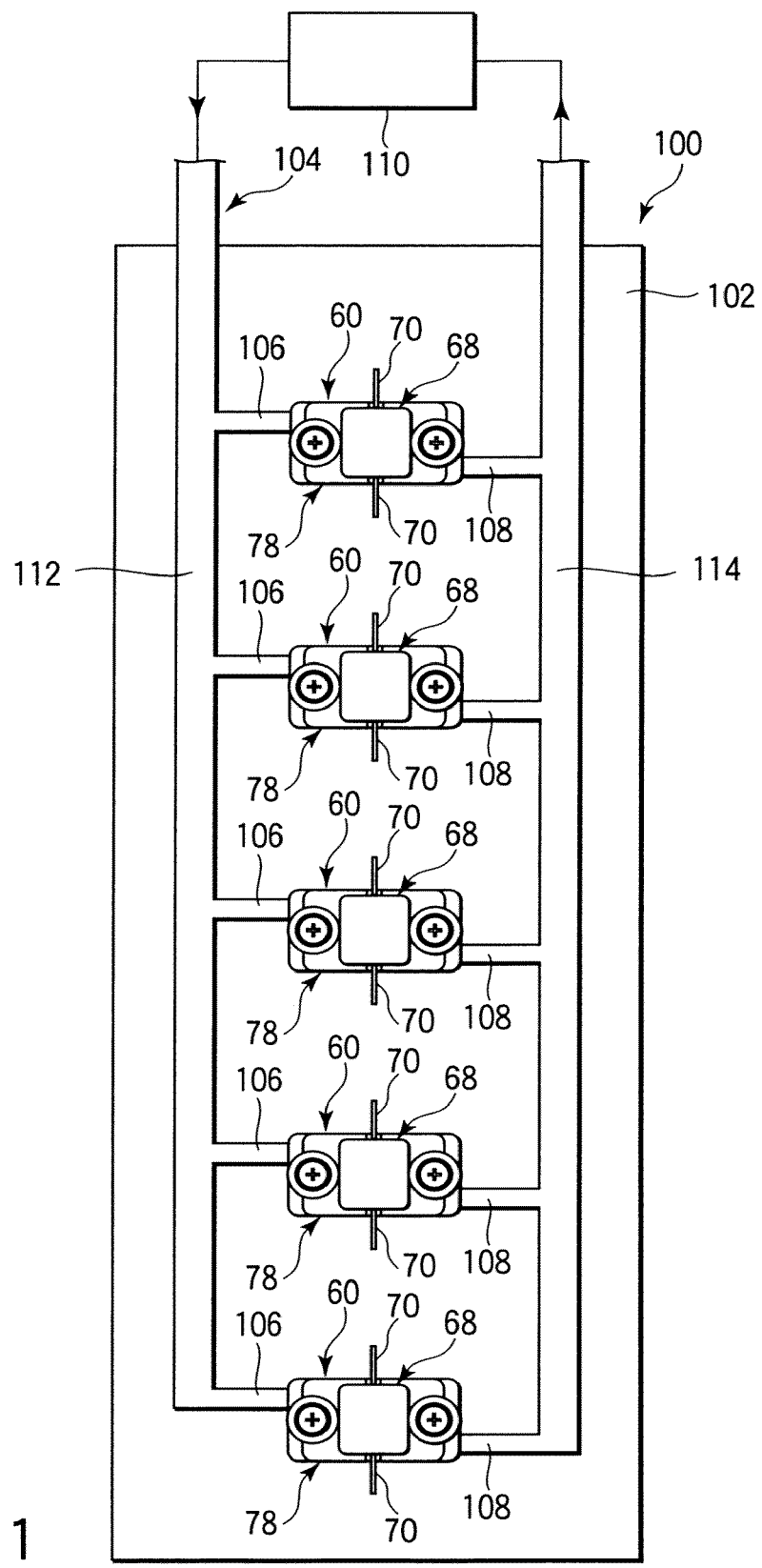
FIG. 11 is a schematic perspective view of a top side of the whole of the second embodiment of the semiconductor package assembly assembled with a plurality of semiconductor packages, each package according to the second embodiment of the present invention.

Next, a semiconductor package assembly 100 according to a second embodiment of the present invention combined with the semiconductor packages 60 each of which is according the above-mentioned second embodiment will be explained with reference to FIG. 11.

The bottom wall 80*d* of the coolant flowing portion 80 of the cooling structure 98 of the semiconductor package 60 is fixed at each of a plurality of predetermined positions on the package support body 102 by well known fixing means, for example, adhesive. The package support body 102 includes a coolant circulation structure 104 which supplies the above-mentioned coolant including liquid to the coolant moving spaces 80*b* of the coolant flowing portions 80 of the cooling structures 98 of the semiconductor packages 60 fixed at the predetermined positions through the coolant supply ports 80*a* of the peripheral walls 80*e* and collects the coolant in the coolant moving spaces 80*b* of the coolant flowing portions 80 through the coolant discharge ports 80*c* of the peripheral walls 80*e*.

The bottom wall 80*d* of the coolant flowing portion 80 of the cooling structure 98 of the semiconductor package 60 is fixed at each of a plurality of predetermined positions on the package support body 102 by well known fixing means, for example, adhesive. The package support body 102 includes a coolant circulation structure 104 which supplies the above-mentioned coolant including liquid to the coolant moving spaces 80*b* of the coolant flowing portions 80 of the cooling structures 98 of the semiconductor packages 60 fixed at the predetermined positions through the coolant supply ports 80*a* of the peripheral walls 80*e* and collects the coolant in the coolant moving spaces 80*b* of the coolant flowing portions 80 through the coolant discharge ports 80*c* of the peripheral walls 80*e*.

The coolant circulation structure 104 includes coolant supply pipes 106 having one ends connected to a coolant supply port of a coolant cooler described in detail later and the other ends connected to the coolant supply ports 80*a* of the coolant flowing portions 80 of the cooling structures 98 of the semiconductor packages 60 at the predetermined positions on the package support body 102. The coolant circulation structure 104 further includes coolant collecting pipes 108 having one ends connected to the coolant discharge ports 80*c* of the coolant flowing portions 80 of the cooling structures 98 of the semiconductor packages 60 at the predetermined positions on the package support body 102 and the other ends connected to a coolant collecting port of the coolant cooler described in detail later.

The coolant supply pipes 106 connected to the coolant supply ports 80*a* of the coolant flowing portions 80 of the cooling structures 98 of the semiconductor packages 60 at the plurality of predetermined positions on the package support body 102 are connected to an integrated coolant supply pipe 112 extending from the coolant supply port of the coolant cooler 110, and the coolant discharge pipes 108 connected to the coolant discharge ports 80*c* of the coolant flowing portions 80 of the cooling structures 98 of the semiconductor packages 69 at the plurality of predetermined positions are connected to an integrated coolant collecting pipe 114 extending toward the coolant collecting port of the coolant cooler 110.

As described above, the semiconductor device accommodating portions 66 of the package main bodies 68 are fixed by the fixing elements 92 to the coolant flowing portions 80 of the cooling structures 78 of the semiconductor packages 60 fixed at the plurality of positions on the package support body 102. The package support body 102 is a circuit board including an upstream circuit using the basic circuits 65 including the semiconductor devices 64 and accommodated in the semiconductor device accommodating portions 66, and outer ends of the external connection terminal members 70 of the semiconductor packages 60 at the plurality of positions are connected to the circuit board.

In the semiconductor package assembly 100 according to the second embodiment described above with reference to FIG. 11, the coolant is supplied from the coolant supply port of the coolant cooler 110 to the coolant supply ports 80*a* of the coolant flowing portions 80 of the cooling structures 78 of the semiconductor packages 60 through the integrated coolant supply conduit 112 of the coolant circulation structure 104 of the package support body 102 and the coolant supply pipes 106 corresponding to the cooling structures 78 of the semiconductor packages 60 during operations of the semiconductor devices 64 in the plurality of semiconductor packages 60. The coolant which has passed through the plurality of clearances among the plurality of fins of the heat radiation area enlarging member 84 in the coolant moving space 80b of the coolant flowing portion 80 is discharged to the corresponding coolant collecting pipe 108 of the coolant circulation structure 104 through the coolant discharge port 80c of the coolant flowing portion 80. The discharged coolant is collected from the coolant recovery pipes 108 to the coolant collecting port of the coolant cooler 110 through the integrated coolant collecting pipe 114.

The Heat generated by the semiconductor devices 64 with operations of the semiconductor devices 64 is transferred to the partition wall 76 of the semiconductor device accommodating portion 66 of the package main body 68 where the plurality of fins of the heat radiation area enlarging member 84 protrudes in the coolant moving space 80b of the coolant flowing portion 80 of the cooling structure 68 and is cooled by the coolant therein, and the heat is further carried out from the plurality of fins of the heat radiation area enlarging member 84 by the coolant moving in the coolant moving space 80b of the coolant flowing portion 80.

Since the coolant including liquid has a large heat capacity, temperature rise of the semiconductor devices 64 in the semiconductor device accommodating portion 66 of the package main body 68 is suppressed within a predetermined range. In addition, the temperature distribution of the whole of each semiconductor device 64 becomes approximately even. Accordingly, as described above, even if the semiconductor device 64 is a semiconductor integrated circuit which generates a large amount of heat during its operation and which is easily breakable by thermal strain, such as typified by a semiconductor integrated circuit made of, for example, gallium nitride system, instability of operation as well as stopping of operation and cracking is not caused in the semiconductor device 64.

In the semiconductor package 10 according to the first embodiment and described above with reference to FIGS. 1A to 6 and the semiconductor package 60 according to the second embodiment and described above with reference to FIGS. 7 to 10, the heat radiation area enlarging members 34 and 84 protrude from the partition walls 26 and 76 of the semiconductor device accommodating portions 16 and 66 into the coolant flowing portions 30 and 80 of the cooling structures 28 and 78 in the package main bodies 18 and 68, but the heat radiation area enlarging members 34 and 88 can be omitted as far as temperature during operations of the semiconductor devices 14 and 64 accommodated in the semiconductor device accommodating portions 16 and 66 of the semiconductor packages 10 and 60 does not cause operations of the semiconductor devices 14 and 64 to be unstable or to be stopped or breaks of the semiconductor devices 14 and 64 by thermal strain.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A semiconductor package comprising:
a package main body which includes a semiconductor device accommodating portion including a peripheral wall, a lid closing an opening at a first end of the peripheral wall, and a partition wall closing an opening at a second other end of the peripheral wall,
the peripheral wall, together with the lid and the partition wall, defining an inner space accommodating a basic circuit including a semiconductor device, and
the partition wall including inner side and outer side surfaces, the inner side surface including an area surrounded by the peripheral wall and facing the inner space, the outer side surface including an area located under and corresponding to the area of the inner side surface and facing in a direction away from the inner space, and the semiconductor device being thermally connected to the area of the inner side surface;
a plurality of external connection terminal members which is connected to the basic circuit and which protrudes outside the package main body; and
a cooling structure which is continuously formed on the area of the outer side surface of the partition wall with a same material as that of the package main body, and which reduces heat generated by the semiconductor device from the package main body,
the cooling structure comprising a coolant flowing portion, the coolant flowing portion including a coolant supply port to which coolant is supplied, a coolant moving space which is positioned under the area of the outer side surface of the partition wall and in which the coolant moves along the area of the outer side surface of the partition wall, and a coolant discharge port which discharges the coolant supplied from the coolant supply port and moving in the coolant moving space, from the coolant moving space,
the coolant flowing portion including a bottom wall facing the area of the outer side surface of the partition wall through the coolant moving space,
the area of the outer side surface of the partition wall including a heat radiation area enlarging member protruding from the area of the outer side surface in the coolant moving space and being in contact with the bottom wall, and
the coolant supply port and coolant discharge port being formed in the bottom wall and spaced from each other so that the heat radiation area enlarging member is positioned therebetween.
2. The semiconductor package according to claim 1, wherein the heat radiation area enlarging member includes a plurality of fins.
3. A semiconductor package assembly comprising:
a semiconductor package including:
a package main body including a semiconductor device accommodating portion including a peripheral wall, a lid closing an opening at a first end of the peripheral wall, and a partition wall closing an opening at a second other end of the peripheral wall,
the peripheral wall, together with the lid and the partition wall, defining an inner space accommodating a basic circuit including a semiconductor device, and
the partition wall including inner side and outer side surfaces, the inner side surface including an area surrounded by the peripheral wall and facing the inner space, the outer side surface including an area located under and corresponding to the area of the inner side surface and facing in a direction away from the inner space, and the semiconductor device being thermally connected to the area of the inner side surface,
a plurality of external connection terminal members which is connected to the basic circuit and which protrudes outside the package main body, and a cooling structure which is continuously formed on the area of the outer side surface of the partition wall with a same material as that of the package main body, and which reduces heat generated by the semiconductor device from the package main body, the cooling structure comprising a coolant flowing portion, the coolant flowing portion including a coolant supply port to which coolant is supplied, a coolant moving space which is positioned under the area of the outer side surface of the partition wall and in which the coolant moves along the area of the outer side surface of the partition wall, and a coolant discharge port which discharges the coolant supplied from the coolant supply port and moving in the coolant moving space, from the coolant moving space, the coolant flowing portion including a bottom wall facing the area of the outer side surface of the partition wall through the coolant moving space, the area of the outer side surface of the partition wall including a heat radiation area enlarging member protruding from the area of the outer side surface of the partition wall in the coolant moving space and being in contact with the bottom wall, and the coolant supply port and coolant discharge port being formed in the bottom wall and spaced from each other so that the heat radiation area enlarging member is positioned therebetween; and a package support body which is combined with the semiconductor package and which includes a coolant circulation structure including a coolant supply conduit for supplying coolant to the coolant supply port of the cooling structure of the semiconductor package and a coolant collecting conduit for collecting the coolant passed through the coolant flowing portion of the cooling structure through the coolant discharge port of the cooling structure.

4. The semiconductor package assembly according to claim 3, wherein the heat radiation area enlarging member includes a plurality of fins.

5. The semiconductor package according to claim 1, further comprising at least one mounting flange protruding outward from the coolant flowing portion of the cooling structure to be in parallel to the bottom wall of the coolant flowing portion, the at least one mounting flange including at least one fixing element receiving space into which a fixing element for fixing the semiconductor package to a predetermined position of a package support body is received while the bottom wall of the coolant flowing portion of the cooling structure of the semiconductor package is placed on the predetermined position of the package support body.

6. The semiconductor package assembly according to claim 3, wherein the semiconductor package further includes at least one mounting flange protruding outward from the coolant flowing portion of the cooling structure of the semiconductor package to be in parallel to the bottom wall of the coolant flowing portion, the at least one mounting flange including at least one fixing element receiving space into which the at least one fixing element for fixing the semiconductor package to a predetermined position of the package support body is received while the bottom wall of the coolant flowing portion of the cooling structure of the semiconductor package is placed on the predetermined position of the package support body.

* * * * *